United States Patent [19]

Henrich

[11] 4,169,232
[45] Sep. 25, 1979

[54] SIGNAL CONDITIONING CIRCUIT FOR MAGNETIC SENSING MEANS

[75] Inventor: Robert S. Henrich, Farmington Hills, Mich.

[73] Assignee: The Bendix Corporation, Southfield, Mich.

[21] Appl. No.: 828,806

[22] Filed: Aug. 29, 1977

[51] Int. Cl.² ............................................. H03K 5/153
[52] U.S. Cl. .................................... 307/354; 307/358; 307/264; 328/151; 328/165
[58] Field of Search .................. 328/1, 5, 147, 151, 328/162, 165; 307/237, 264, 354, 358, 362, 309, 268; 324/173, 174, 207; 340/146.3 AG

[56] References Cited

U.S. PATENT DOCUMENTS

| | | | |
|---|---|---|---|
| 3,348,065 | 10/1967 | Schmidt | 307/358 X |
| 3,582,679 | 6/1971 | Carp et al. | 307/362 |
| 3,610,956 | 10/1971 | Giordano et al. | 307/354 |

*Primary Examiner*—John Zazworsky
*Attorney, Agent, or Firm*—William A. Marvin; Russel C. Wells

[57] ABSTRACT

A signal conditioning circuit for the output of a magnetic position sensor is disclosed. The magnetic sensor generates a total output signal that increases as a function of the rotational velocity of the sensor with a spurious noise component that is a relatively constant percentage of the actual signal voltage over the speed range. In a preferred embodiment, the signal conditioning circuit discriminates between the noise component and the signal component by comparing the total signal to a variable threshold only after a positive going zero cross. The variable threshold is generated as a function of the peak amplitude of the total signal. In a second embodiment the signal conditioning circuit includes gain control means which varies the amplitude of the total output signal as a function of its peak to maintain the threshold above the noise component.

3 Claims, 10 Drawing Figures

*Fig-2B1*

SIGNAL CONDITIONING CIRCUIT FOR MAGNETIC SENSING MEANS

BACKGROUND OF THE INVENTION

1. Field of the Invention

The invention pertains generally to position sensing apparatus and is more particularly directed to a signal conditioning circuit for a rotational magnetic position sensor.

2. Description of the Prior Art

Rotational magnetic position sensors or reluctance sensors are conventional in the art. Generally, such sensors have a rotating member of a highly permissible material. Magnetically coupled to the rotating member is a sensor pickup for determining the angular relation of the member to the pickup. At predetermined angular events the rotating member may have various means for changing the magnetic coupling between the sensor pickup and the rotating member such as cogs, slots, or holes. As each event passes the sensor pickup, an output is developed which has a positive and negative peak with a zero crossing centered substantially with the time alignment of the sensor and event.

Magnetic sensors such as these are advantageously used in many applications. One of these utilizations that will increase in importance in the future is the position sensing of an internal combustion engine crankshaft, camshaft, or pully wheel attached thereto. With rotational information from the sensor-speed, ignition timing, fuel injection cycles, etc. can be accurately determined. This is accomplished by positioning the angular events on the rotating member in a predetermined relationship with an engine event such as a mark for TDC for the number one cylinder and other marks for fixed increments of degrees around the revolution of the crank shaft.

There is, however, a problem sensing the angular events when magnetic sensors are used in internal combustion engine applications. The operating range of RPM under normal conditions for an engine may vary from 30 RPM while cranking during starting conditions to over 6000 RPM while at a high speed cruise. The sensor must then reliably provide information over this large range. Many magnetic sensors provide a signal that increases with RPM as the signal amplitude is directly proportional to rate of change of magnetic flux coupling the rotating member to the magnetic sensor. The noise component of the signal due to surface imperfections, vibration, non concentric alignment, etc., also increases likewise and remains substantially at a constant percentage of the total output.

Thus, the high speed noise component may be greater than the low speed signal component making it difficult to discriminate between the two. Moreover, the signal component may vary from a few tenths of a volt to tens of volts over the RPM range complicating the discrimination effort even more. Therefore, to provide a useable output signal for processing by other engine circuitry, the sensor output must be conditioned to reject the noise and provide an indication of the angular event with accuracy.

A U.S. Pat. No. 3,801,830 issued to Boyer attempts to solve these problems by providing a comparator circuit with a variable threshold adjustment responsive to the magnitude of the immediately preceeding input signal. When a positive transition of the sensor signal exceeds this threshold the threshold is reduced to a non signal value to detect the zero crossing of the sensor signal. The system then includes a pulse shaper which generates a pulse of a fixed width in response to the positive to negative zero crossing that it has detected. This system is unduly complicated and is more expensive than necessary because it first discriminates between the noise and signal levels and then secondly senses an event, i.e., positive to negative zero crossing. A substantial reduction in circuitry and cost can be achieved by performing these functions simultaneously.

SUMMARY OF THE INVENTION

The invention provides a signal conditioning circuit for simultaneously discriminating between the variable noise and signal levels of the output of a rotational magnetic position sensor and for generating a signal indicative of a zero crossing of the sensor signal.

The signal conditioning circuit includes comparator means for sensing whether the total output signal of the magnetic sensor is greater than a predetermined threshold which is maintained above the noise level component input to the comparator.

In one preferred embodiment the threshold is maintained above the noise component of the sensor signal by varying the threshold with peak detector means in proportion to the peak amplitude of the magnetic sensor signal.

In another preferred embodiment the threshold is maintained above the noise component of the magnetic sensor signal by attenuating the magnetic sensor signal with peak detector means in proportion to the peak amplitude of the magnetic sensor signal input.

The comparison between the sensor signal and threshold is performed after the zero crossing of the magnetic sensor signal to provide a leading edge pulse output of the comparator indicative of the zero crossing. By performing the comparison at this point, both of the functions of noise discrimination and zero crossing are performed simultaneously according to an important object of the invention. The leading edge indication provides the optimum form of angular position information according to another object of the invention.

These and other objects, features and aspects of the invention will become clearer and more fully understood from a reading of the detailed description when taken in conjunction with the attached drawings wherein:

DETAILED DESCRIPTION

Figure 1:
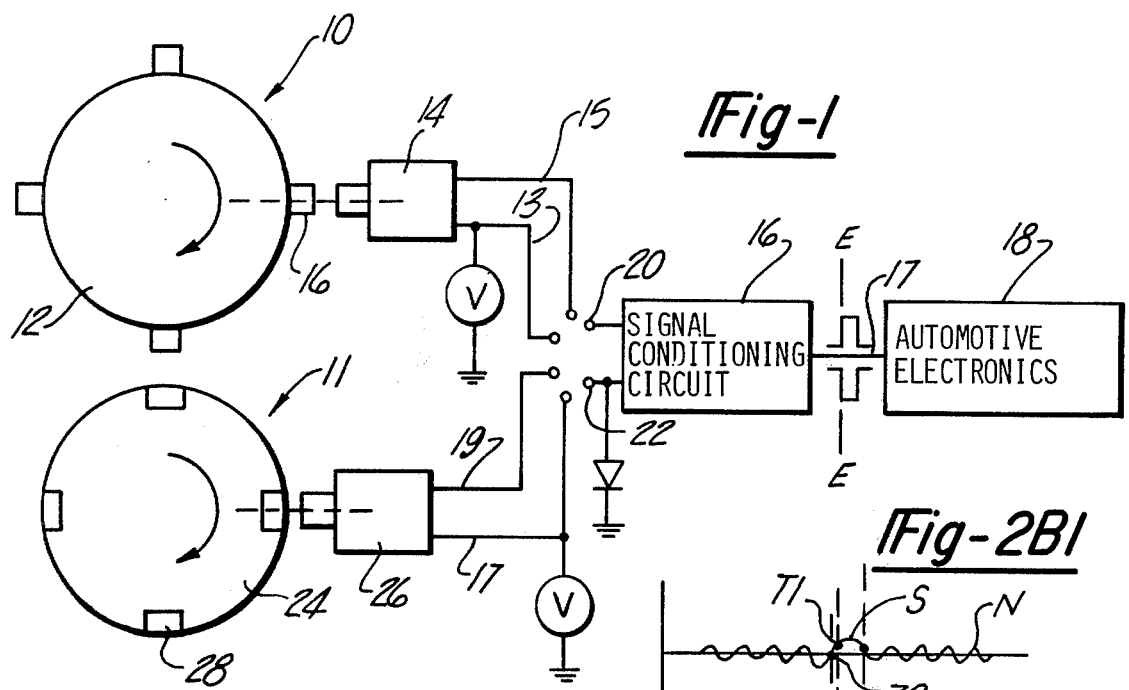
FIG. 1 is a schematic system diagram of a rotational magnetic position sensor incorporating and constructed in accordance with the present invention.

Referring now to FIG. 1 there is shown a magnetic position sensing means generally designated 10 having a rotational member 12 and a stationary magnetic sensor pickup 14. The magnetic sensor pickup 14 is coupled to the rotational member 12 by a magnetic field that is substantially constant. As the rotating member 12 turns, the field, and hence, the signal output from the sensor pickup 14 will be substantially constant until an angular event 16, in this instance a cog, perturbates the steady condition of the system. The sensor pickup 14 will then respond to this perturbation of the magnetic field and produce a sensor output to the inputs 20, 22 of a signal conditioner circuit 16.

The signal conditioner circuit 16 provides a pulse via a signal line 17 to automotive electronics 18 for use in determining engine events that are associated with the angular event 16.

Generally, the sensor signal output is an alternating current offset by DC level because of voltage +V lifting the sensor output from ground. The magnetic field amplitude will thus remain substantially positive as the rotational member turns until the leading edge of cog 16 begins a passage of the sensor tip of magnetic sensor pickup 14. Accordingly, a positive peak signal will be developed and will then roll off and cross the DC value to become a negative peak and thereafter return to the steady state value. It has been found that the AC zero crossing of the signal or reference value crossing of the signal will occur when the cog and sensor are in substantial alignment and, therefore, will provide the most accurate angular position indication. The zero crossing is the event which the signal conditioning means provides as a leading edge E from its output to the automotive electronics 18, either as a positive going pulse or a negative going pulse as illustrated.

Alternatively, a magnetic snesor pickup 26 is shown which is magnetically coupled to a rotational member 24 with slots 28 instead of the cog 16. As was seen for the rotational member 16, a signal is developed by the rotational motion of the member 24 in relation to the magnetic sensor pickup 26. The signal produced by signal 26, however, is at its steady state until one of the slots comes into proximity of the sensor and thereafter the magnetic coupling drops because of the higher reluctance of the slot over the material forming the member 24. This perturbation of the field will produce a negative going pulse to a peak with a subsequent zero cross and positive peak as the member rotates past the sensor 24. Again the zero crossing or reference crossing is the event which indicates substantial alignment of the slot with the sensor pickup stub. Further, with a sensor coupled to a rotating member with a plurality of holes or voids, the output signal will resemble that of the sensor 26 because of the drop is permissivity as the void transits the sensor pickup stub.

Thus, it can be seen that by the geometrical alteration of the rotational member either a positive going transition having a positive to negative zero crossing and negative transition can be obtained, or a negative transition with a negative to positive zero crossing and positive pulse thereafter can be obtained. Further, because of the DC offset voltages of sensor pickups 14 and 26, the signal forms may be reversed by merely changing the polarity of the leads and thus the most advantageous form may be used for further processing in signal conditioner circuit 16. Therefore, signal lead pairs 13, 15 and signal lead pairs 17, 19 can be connected as desired to terminals 20, 22 to give the form of magnetic sensor signal wanted.

Advantageously, according to the preferred embodiment, the negative going pulse with a negative to positive zero crossing and subsequent positive pulse is the preferred form chosen for signal conditioning. This form of magnetic sensor output signal allows the signal conditioning circuit to simultaneously provide noise discrimination and zero crossing detection. Also, this particular form can be obtained in a facile manner from the many geometries of reluctance sensors as described above.

Figure 2A:
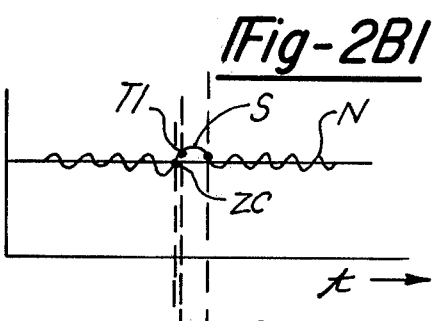
FIGS. 2A–2F are representative schematics illustrating various wave forms for the system according to FIG. 1.
Figure 2A:
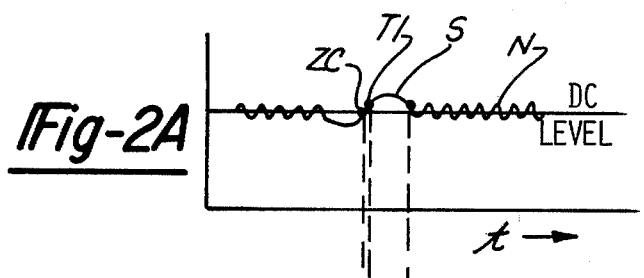

Turning to FIG. 2A, there is shown the signal output from a magnetic sensor at a particular speed having a signal component S and a noise component N. It is seen that the noise component N is some substantial percentage of the signal component S, and further, that the signal component S has a DC offset level at which it first performs a negative transition and then crosses the DC level at a zero crossing ZC going in a negative to positive direction. The signal S is thereafter positive peaking before it returns to the DC level.

Figure 2B:
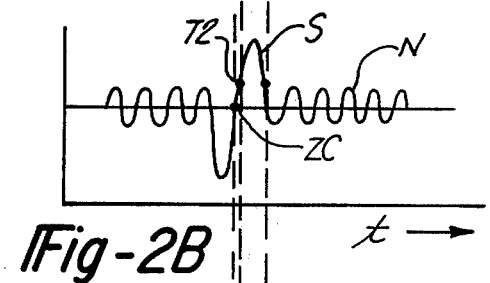

FIG. 2B shows an output of the same sensor for a higher speed as is conventional where the peak of the output signals is much greater than its noise component N, but where the noise component N is greater than the signal level S at the lower RPM. Thus a form of discrimination is needed to discriminate between the signal S and the noise level N and to also simultaneously sense the zero crossing ZC across the automotive RPM spectrum of frequencies.

Figure 2C:
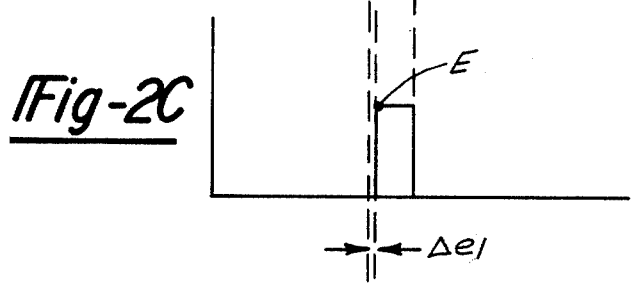

According to the invention, signal conditioner circuit 16 provides a positive threshold $T_1$ at the low RPM (FIG. 2A) which is higher than the noise level and which will additionally provide a transition or leading edge of a pulse E as seen in FIG. 2C when the sensor signal exceeds the threshold. The signal conditioner circuit 16 will subsequently provide a falling edge when the signal is less than the threshold. It is evident that by using the form of magnetic sensor output having a negative to positive zero crossing, the signal conditioner circuit 16 in this manner can wait until the zero crossing occurs and detect it simultaneously with the noise discrimination threshold.

Figure 2D:
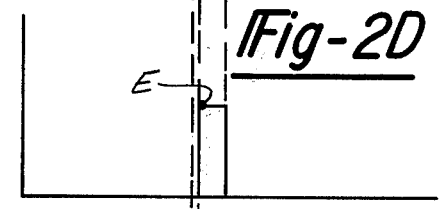

Signal conditioner 16 also varies the comparison threshold in proportion to the peak of the signal S to remain above the noise level N as seen in FIG. 2B where the threshold $T_2$ is larger than the threshold $T_1$. Likewise, for the higher RPM signal in FIG. 2B the signal conditioning circuit 16 will provide a leading edge of a pulse E by comparison as illustrated in FIG. 2D when the signal S is greater than the threshold $T_2$ and will provide a falling edge as the signal falls below the threshold $T_2$. This leading edge is an indication of the discrimination of the noise signal and the sensor signal S while additionally being a simultaneous indication of the zero crossing ZC.

An alternative method of maintaining the threshold above the noise level N is illustrated in FIG. 2B$_1$ where a higher RPM signal S and the noise N are attenuated in proportion to the peak of the magnetic sensor output signal. The graphs in FIGS. 2B and 2B$_1$ are at the same RPM and in the same scale. This embodiment allows the signal conditioner circuit 16 to maintain a single threshold $T_1$. A comparison is provided by the conditioner circuit 16 to generate a leading edge E when the signal S is greater than $T_1$ and a falling edge when less than $T_1$ in a similar manner to the variable threshold embodiment. This method varies the input in relation to the peak instead of the threshold.

Figure 2E:
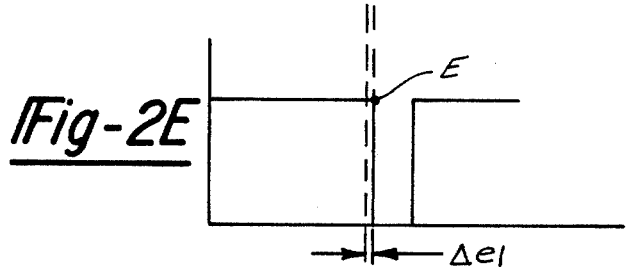

There is, of course, a slight error $\Delta e_1$ as seen in FIG. 2E between the actual zero cross and the leading edge indication of the zero cross. The higher speed errors are illustrated as $\Delta e_2$ in FIG. 2F. It is noted that the simultaneous discrimination and indication may be done in the facile manner described above because surprisingly the error $\Delta e_2$ at high speeds for the alternate embodiments and the error $\Delta e_1$ at low speeds is not significantly different or great enough in either case to make the leading edge non-useful as an indication of the zero crossing. At higher speeds the threshold $T_2$ will move up the signal slope to higher levels, but as the signal has a frequency directly related to RPM, the slope becomes greater and the error remains substantially constant, while at the lower speeds the threshold $T_1$ may be brought close enough to the zero crossing (because of the low actual noise level or the attenuated noise level of the embodiment described for FIG. 2B$_1$) to be substantially indicative thereof. With this method, using commercially available sensors such as Model No. 3025 manufactured by the Electro Corporation, 1845 57th Street, Sarasota, Fla. 33580, errors on the order of between one tenth to three tenths of one degree are reasonably achievable. This assumes an initial setting of the threshold of approximately 0.25 V for a system generating a 0.2 V noise level at the lowest speed and a peak to threshold ratio of substantially 5:1 thereafter. Thus, by sensing the negative to positive going zero cross by this variable threshold or variable attenuation method, an advantageous process has been described as above.

It is noted that the pulse widths in FIGS. 2C and 2D are different with the widest pulse width found at the lowest speeds and shorter pulses at higher speeds. Each pulse width is approximately one half the period of the magnetic sensor signal which, as was stated before, is functionally related to the RPM. Since most digital electronics today are level sensors and edge fired, the leading edge as the indication of the zero crossing is the most optimal form of the output signal from the conditioner circuit and the width of the pulse is relatively unimportant. In practice, the automotive electronics may differentiate the leading edge to eliminate substantially all the pulse width.

Figure 2F:
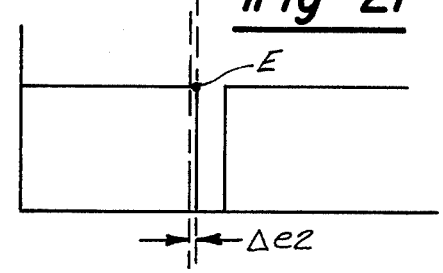

In FIGS. 2E and 2F are shown as signal forms generated by signal conditioner 16 which invert the signals generated in FIGS. 2C, and 2D. Instead of the leading edge having a positive going transition indicating the negative to positive going zero crossing, the FIG. 2E illustrates the leading edge as a falling edge as does FIG. 2F.

Figure 3:
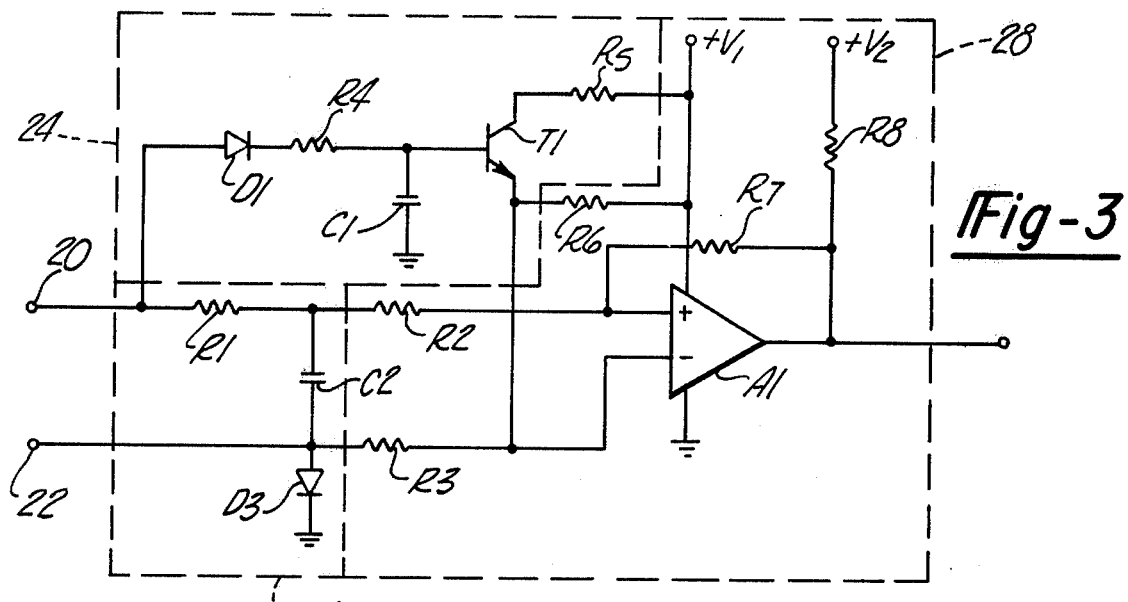
FIG. 3 is a detailed electrical schematic diagram of a preferred embodiment of the signal conditioning means for the system according to FIG. 1.

FIG. 3 is a schematic diagram of a preferred embodiment for processing the magnetic sensor output as it appears at the conditioning circuit 16 input terminals 20, 22 during transitions in the signal. The input terminals, a source terminal 20, and a reference terminal 22 cooperate with the circuitry shown in FIG. 3 to produce the conditioned output by the method previously described at the pulse output terminal 30. The source terminal 20 is connected to the noninverting input of an operational amplifier A1 through a pair of series resistors R1 and R2 while the reference terminal 22 communicates to the inverting input of the amplifier A1 via resistor R3. The reference terminal 22 is further provided with a diode D3 to raise the terminal above ground potential by the forward voltage drop of the diode. Poling the diode D3 with its anode connected to the reference terminal and its cathode connected to ground is a facile method of providing the small +0.6 V level for the amplifier A1 to allow operation in its linear range.

A high frequency transient shunt by a capacitor C2 is provided between the terminals by joining one input of the capacitor to the junction of the resistors R1, R2 and the other terminal to the anode of the diode D3.

The amplifier A1 also contains a latching or hysteresis resistor R7 connected between its non-inverting input and its output for controlling the amount of comparison rate or the slew rate of the amplifier. The latching resistor provides positive feedback to the input to produce clean edge transitions as is conventional. A pull-up resistor R8 is provided between a positive source of voltage +V$_2$ and the output terminal 30 to provide output transitions as the amplifier sinks current from the positive supply of voltage. Ideally, +V$_2$ is a level compatible with high speed digital logic circuitry to which the output terminal 30 is connected directly.

The circuitry of FIG. 3 further includes a threshold control loop comprising in part a peak circuit means 24 having a resistor R4, a capacitor C1, and a controlled variable impedance means, a transistor T1. The peak detector means has the resistor R4 provided between the base of the transistor T1 and the input source terminal 20. In series with the resistor R4 is a diode D1 poled for a positive current direction to capacitor C1 connected in parallel between the base of the transistor and ground. The switching means T1 has a current limiting resistor R5 connected between a positive source of voltage +V$_1$ and the collector. A threshold voltage resistor R6 is connected between the same positive voltage +V$_2$ and the inverting input of amplifier A1. An initial threshold voltage, the divider combination of R6, R3, is provided by these connections.

In operation the magnetic sensor signal as described (negative to positive zero crossing) is input to terminals 20, 22 of the signal conditioner circuit 16 and low-pass filter 26 filters a portion of the high-frequency noise component from the input. The time constant of the filter as determined by R1, C2 should not substantially attenuate signal frequencies. The input is thereafter compared to the threshold voltage which is formed by the the voltage divider R3, R6 at the non inverting input of amplifier A1. If the signal is greater, the amplifier A1 will provide a relatively positive signal at the output 30 or will remain at the zero level if the signal is less than the offset level or threshold level. For positive edge transitions, the latching resistor R7 will provide a crisp edge and hold it for the output. The amplifier A1 will thereafer provide this relatively high output until the signal level falls somewhat below the threshold. The comparison is accomplished only after the first half of the wave has occurred by using the negative to positive zero cross.

A peak detector means D1, R4 and C1 of peak circuit means 24 provides a variable voltage level to the base of transistor T1 to change the offset voltage in direct proportion to the peak amplitude of the magnetic sensor signal. The previous positive peak is used as D1 is poled for the positive polarity. Transistor T1 will change its impedance in relation to its gain by allowing more current to flow through the resistor R5 in a controlled form.

Normally, the charging rate for C1 which is determined by R1, C1 should be relatively quick in order to follow the changes in RPM with a slower discharge which can approximate the time it will take an engine to decelerate because of the inertia of the engine. A single peak detector circuit as shown can be used since although the rate of pulse changes with RPM, their width changes oppositely. The energy content of the pulses remains much the same because the amplitude increases.

Thus, the output of the peak detector means is directly related to the peak over the RPM range indicated.

Thus, the variable threshold has been formed to allow the operational amplifier A1 to sense the negative to positive zero crossing of the signal and to simultaneously discriminate noise signals from the sensor output signal. Pull-up resistor R8 allows the source connected at its terminal to be of the level used in driving digital circuitry so that the pulse needs no other signal conditioning before it can be used in the automotive electronics 18. No negative supply is needed because the amplifier A1 is designed for operation between $+V_1$ and ground.

Figure 4:
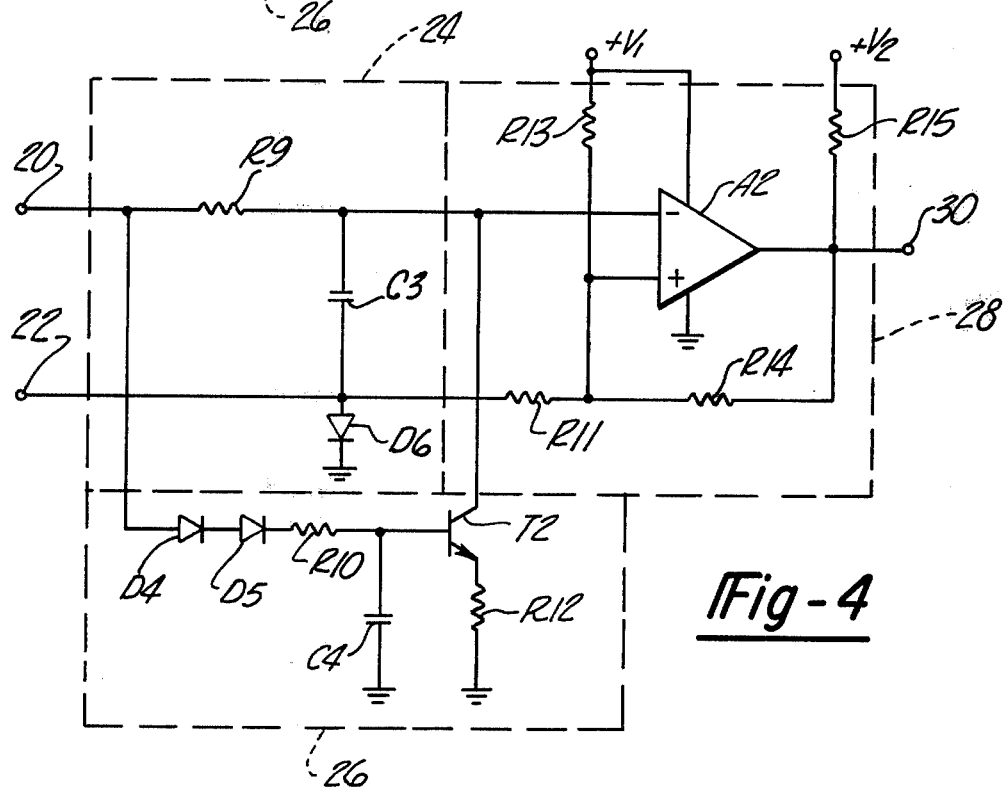
FIG. 4 is a detailed electrical schematic diagram of an alternate embodiment of the signal conditioning means for the system according to FIG. 1.

With reference directed to the next drawing FIG. 4, there another alternative embodiment of the invention will now be more fully described. Source terminal 20 communicates with the inverting input of an amplifier A2 over a filter resistor R9. Attached to the other reference terminal 22 is the non-inverting input of the amplifier A2 via a resistor R11. Connecting the two terminals 20 and 22 together is a noise rejection capacitor C3 which is further connected at the reference terminal 22 by a diode D6 to ground. The amplifier A2 further has a threshold bias resistor R13 connected between a source of voltage supply $+V_1$ and its non-inverting input. At the junction of resistors R11, R13 is further connected a latching resistor R14. Pull-up for the amplifier A2 is provided by a resistor R15 connected between the output terminal of the amplifier and a positive voltage supply $+V_2$ as shown. These components operate similarly to the corresponding components of the first embodiment.

Included in this configuration is a gain control loop comprising a peak circuit means 26 including a resistor R10 connected to a base of a transistor I2 and a capacitor C4 connected at that base junction at one terminal and to ground at the other. Two positively poled diodes D4 and D5 communicate positive signals from the source terminal 20 to the input of the peak circuit means via their connection between the terminal and R10.

The collector of the transistor T2 is connected at the inverting input of the amplifier A2 to modify the signal over the source terminal 20 in response to the voltage produced by the peak detector means. The transistor 22 is further provided with a current limiter resistor R12 which prevents the transistor T2 from shunting more than a certain portion of the magnetic sensor signal to ground.

In operation the circuit of FIG. 4 will receive the magnetic sensor signal over terminals 20, 22 and compare it to the threshold voltage (divider R13, R11) at the non-inverting input of amplifier A2. Resistor R9 and capacitor C3 again filter a portion of the high-frequency noise through the diode D6 to ground. The constant threshold voltage is formed by the voltage divider of resistor R11 and R13 to the non-inverting input and the signal input to the inverting input. Thus amplifier A2, which is normally at a level above ground, $+V_2$, will produce, if the input to terminal 20 is larger than the constant threshold set a falling edge which is latched in by resistor R14. When the voltage level at terminal 20 with respect to 22 is less than the offset voltage, the amplifier A2 will return to the higher voltage level. This is the type of pulse signal as shown in FIG. 2F.

According to the second embodiment of the invention, the peak detector R10, C4 receives an input via diodes D4, D5 to form a voltage which is substantially proportional to the positive peaks of the sensor signal to drive the base of the transistor T2. Diodes D4, D5 provide a 1.2 V offset before the peak detector becomes operative. T2, depending on the base drive, is a variable resistance which in combination with the input resistor R9 forms a variable attenuator for the peak input signal from the magnetic sensor. The larger the signal and the noise component, the more attenuation is provided by the transistor resistor combination. Therefore, the offset voltage of the amplifier A2 remains in excess of the noise level and thus provides a point at which the falling edge can be generated in substantial synchronism with the negative to positive zero crossing of the sensor signal. The amount of attenuation provided is most advantageously that used for the variable threshold embodiment or a 5:1 ratio. Thus, the peak input signal will be limited or attenuated to approximately five times the predetermined offset voltage. The charging and discharging rates of the variable attenuator peak detector means can be similar to the peak detector means of FIG. 3.

Thus, as is seen in FIGS. 3 and 4, advantageous embodiments of circuitry have been developed to accomplish the stated objectives of the invention. One obvious modification of the circuitry described before can include the provision for a negative threshold where a negative going zero cross is sensed after it occurs by the method of the invention. While preferred embodiments have been shown, it will be obvious to those skilled in the art that various modifications and changes can be made thereto without departing from the spirit and scope of the invention as defined in the following claims:

What is claimed:

1. A method of detecting a zero crossing of a variable amplitude signal component of an output signal having a positive peak and a negative peak while simultaneously discriminating between a variable amplitude noise component of said output signal and said signal component, said method comprising:
    providing a threshold signal with which to compare said signal component;
    maintaining said threshold signal in excess of said noise component for varying amplitudes of said signal component and said noise component;
    waiting until a zero crossing occurs which it is desired to detect;
    comparing said output signal to said threshold signal after the zero crossing has occurred to simultaneously detect said zero crossing and discriminate between said noise component and said signal component, and;
    generating an edge transition in response to said signal component obtaining an absolute value which is larger than the absolute value of said threshold signal.

2. A method of detecting a zero crossing as defined in claim 1 wherein said step of maintaining said threshold signal includes the step of:
    varying said threshold signal proportionally to the peak amplitude of said signal component.

3. A method of detecting a zero crossing of a variable amplitude signal component of an output signal having a positive peak and a negative peak while simultaneously discriminating between a variable amplitude noise component of said output signal and said signal component, said method comprising:
    providing a threshold signal with which to compare said signal component;

maintaining said threshold signal in excess of said noise component for varying amplitudes of said signal component and said noise component by attenuating said signal component the said noise component before comparison to said threshold signal proportionally to the peak amplitude of said signal component;

waiting until a zero crossing occurs which it is desired to detect;

comparing said output signal to said threshold signal after the zero crossing has occurred to simultaneously detect said zero crossing and discriminate between said noise component and said signal component, and;

generating a leading edge transition in response to said signal component obtaining an absolute value which is larger than the absolute value of said threshold signal.

* * * * *